United States Patent
Shoji (10) Patent No.: US 10,269,538 B2
(45) Date of Patent: Apr. 23, 2019

(54) FILM DEPOSITION APPARATUS AND METHOD FOR CLEANING FILM DEPOSITION APPARATUS

(71) Applicant: Sakai Display Products Corporation, Sakai-shi, Osaka (JP)

(72) Inventor: Atsushi Shoji, Sakai (JP)

(73) Assignee: Sakai Display Products Corporation, Sakai-shi, Osaka (JP)

(*) Notice: Subject to any disclaimer, the term of this patent is extended or adjusted under 35 U.S.C. 154(b) by 0 days.

(21) Appl. No.: 15/558,888

(22) PCT Filed: Mar. 27, 2015

(86) PCT No.: PCT/JP2015/059701
§ 371 (c)(1),
(2) Date: Sep. 15, 2017

(87) PCT Pub. No.: WO2016/157312
PCT Pub. Date: Oct. 6, 2016

(65) Prior Publication Data
US 2018/0068832 A1    Mar. 8, 2018

(51) Int. Cl.
*H01L 21/31* (2006.01)
*C23C 16/54* (2006.01)
(Continued)

(52) U.S. Cl.
CPC .... *H01J 37/32009* (2013.01); *C23C 16/4405* (2013.01); *C23C 16/54* (2013.01);
(Continued)

(58) Field of Classification Search
CPC .............. C23C 16/54; C23C 16/4405; H01J 37/32009; H01L 21/31; H01L 21/707; H01L 21/3065; H01L 21/205; H01L 21/02
See application file for complete search history.

(56) References Cited

U.S. PATENT DOCUMENTS

2002/0011210 A1    1/2002  Satoh et al.
2003/0036272 A1*   2/2003  Shamouilian ............. B08B 7/00
                                                           438/691
(Continued)

FOREIGN PATENT DOCUMENTS

JP    2001-274105 A    10/2001
JP    2003-264186 A    9/2003
(Continued)

OTHER PUBLICATIONS

Machine translation of JP2005-056925 (Itabashi et al, Hitachi Ltd) (Jan. 2014) 9 pages.*

(Continued)

*Primary Examiner* — Caridad Everhart
(74) *Attorney, Agent, or Firm* — Rudy J. Ng; Bret E. Field; Bozicevic, Fields & Francis LLP (57) ABSTRACT

An example film forming device is provided with: a chamber for forming a film on a substrate; a supply tube for supplying a cleaning gas to the chamber; and a plasma generating unit, which is provided to the supply tube, and which generates plasma from the cleaning gas. The film forming device is characterized by being provided with: a temperature control unit that controls the temperature of the supply tube to temperature equal to or higher than a predetermined temperature; and a supply unit which supplies, each time when a previously set time equal to or shorter than 36 hours elapses, the chamber with the plasma thus generated by the plasma generating unit.

10 Claims, 6 Drawing Sheets

(51) Int. Cl.
- *H01J 37/32* (2006.01)
- *H01L 21/205* (2006.01)
- *H01L 21/3065* (2006.01)
- *H01L 21/02* (2006.01)
- *H01L 21/70* (2006.01)
- *C23C 16/44* (2006.01)

(52) U.S. Cl.
CPC ............ *H01L 21/02* (2013.01); *H01L 21/205* (2013.01); *H01L 21/3065* (2013.01); *H01L 21/31* (2013.01); *H01L 21/707* (2013.01)

(56) References Cited

U.S. PATENT DOCUMENTS

| | | | |
|---|---|---|---|
| 2003/0170402 A1 | 9/2003 | Arai et al. | |
| 2006/0090700 A1* | 5/2006 | Satoh | C23C 16/4405 118/715 |
| 2008/0115801 A1* | 5/2008 | Chin | C23C 16/4405 134/1.2 |
| 2008/0268644 A1 | 10/2008 | Kameda et al. | |
| 2014/0287594 A1* | 9/2014 | Terasaki | H01L 21/02164 438/770 |
| 2015/0270119 A1* | 9/2015 | Yahata | C23C 16/4405 438/758 |

FOREIGN PATENT DOCUMENTS

| | | |
|---|---|---|
| JP | 2005-056925 A | 3/2005 |
| JP | 2006-190741 A | 7/2006 |
| JP | 2008-028307 A | 2/2008 |
| JP | 2008-218984 A | 9/2008 |
| JP | 5389924 B2 * | 1/2014 ............ C23C 16/04 |
| WO | WO2011013810 A1 | 2/2011 |

OTHER PUBLICATIONS

Machine translation of JP 2006-190741 (Yamada, Seiko Epsom Corp.) (Jul. 2006) 19 pages.*

Machine translation of JP5-389924 (Harada, ULVAC Inc.) (Jan. 2014) 20 pages.*

* cited by examiner

FILM DEPOSITION APPARATUS AND METHOD FOR CLEANING FILM DEPOSITION APPARATUS

CROSS-REFERENCE TO RELATED APPLICATIONS

This application is the national phase under 35 U.S.C. § 371 of PCT International Application No. PCT/JP2015/059701 which has International filing date of Mar. 27, 2015 and designated the United States of America.

FIELD

The technology herein relates to a film deposition apparatus which forms a film on a substrate installed in a chamber, and a method for cleaning the film deposition apparatus.

BACKGROUND AND SUMMARY

A film deposition apparatus which forms a film on a substrate, for example, a chemical vapor deposition (CVD) apparatus has been proposed in the related art. The film deposition apparatus described in Patent Document 1 includes a reaction chamber configure to form a film on a substrate, a cleaning gas supply means provided outside the reaction chamber, and a remote plasma discharge device. The remote plasma discharge device and the reaction chamber are connected with each other by a pipe.

The cleaning gas supply means supplies a cleaning gas (for example, $NF_3$) to the remote plasma discharge device.

The remote plasma discharge device generates plasma from the supplied cleaning gas, the generated plasma is introduced into the reaction chamber to vaporize deposits in the reaction chamber, and is discharged by a vacuum pump.

In the pipe that connects the remote plasma discharge device and the reaction chamber, the plasma may react with the pipe to make particles be deposited thereon. For example, when the pipe is made of an aluminum member and the cleaning gas is made of $NF_3$, aluminum fluoride may be generated and particles are deposited on the pipe.

In consideration of the above-mentioned circumstances, it is an object to provide an aspect of disclosure of a film deposition apparatus which may prevent deposition of particles in a path through which a cleaning gas is supplied to a chamber, and a method for cleaning the film deposition apparatus.

According to an aspect of disclosure, there is provided a film deposition apparatus comprising: a chamber configured to form a film on a substrate; a supply pipe configured to supply a cleaning gas to the chamber; a plasma generation unit which is provided in the supply pipe to generate plasma from the cleaning gas; temperature control unit configured to control temperature of the supply pipe to a predefined temperature or higher; and a supply unit configured to supply the plasma generated by the plasma generation unit to the chamber each time when a preset time of 36 hours or less passes.

According to another aspect of the film deposition apparatus, the predefined temperature is 100° C., and the temperature control unit controls driving of the plasma generation unit so that temperature of the generated plasma reaches 100° C. or higher.

According to another aspect of the film deposition apparatus, the predefined temperature is 100° C., the supply pipe is provided with a heater, and the temperature control unit controls driving of the heater.

According to another aspect of the film deposition apparatus in the present invention, the time of 36 hours or less is 5 to 36 hours.

According to an aspect of disclosure, there is a method for cleaning a film deposition apparatus in which, after forming a film on a substrate installed in a chamber, plasma is generated from a cleaning gas by a plasma generation unit, and the generated plasma is supplied to the chamber through a supply pipe to clean the supply pipe. The method further comprises the processes of controlling temperature of the supply pipe so that the temperature of the supply pipe is a predefined temperature or higher, and supplying the plasma generated by the plasma generation unit to the chamber each time when a preset time of 36 hours or less passes.

According to the film deposition apparatus and the method for cleaning the film deposition apparatus, the temperature of the supply pipe is set to temperature at which particles are not deposited, and cleaning is performed for 36 hours or less from the end of the previous cleaning, so that the gas in the supply pipe is discharged.

According to the film deposition apparatus, the temperature of the plasma generated by the plasma generation unit is set to be 100° C. or higher, so that the temperature of the supply pipe is going to be 100° C. or higher.

According to the film deposition apparatus, the supply pipe is heated by the heater, and the temperature of the supply pipe is set to be 100° C. or higher.

According to the film deposition apparatus, the substances such as gas in the supply pipe are discharged at an interval of 5 to 36 hours.

In accordance with the film deposition apparatus and the method for cleaning the film deposition apparatus, the temperature of the supply pipe is set to the temperature at which the particles are not deposited. In addition, the cleaning is performed for 36 hours or less from the end of the previous cleaning, such that it is possible to discharge the substances in the supply pipe, before the deposition of particles is too apparent.

The above and further objects and features will more fully be apparent from the following detailed description with accompanying drawings.

DETAILED DESCRIPTION OF NON-LIMITING EXAMPLE EMBODIMENTS

Embodiment 1

Figure 1:
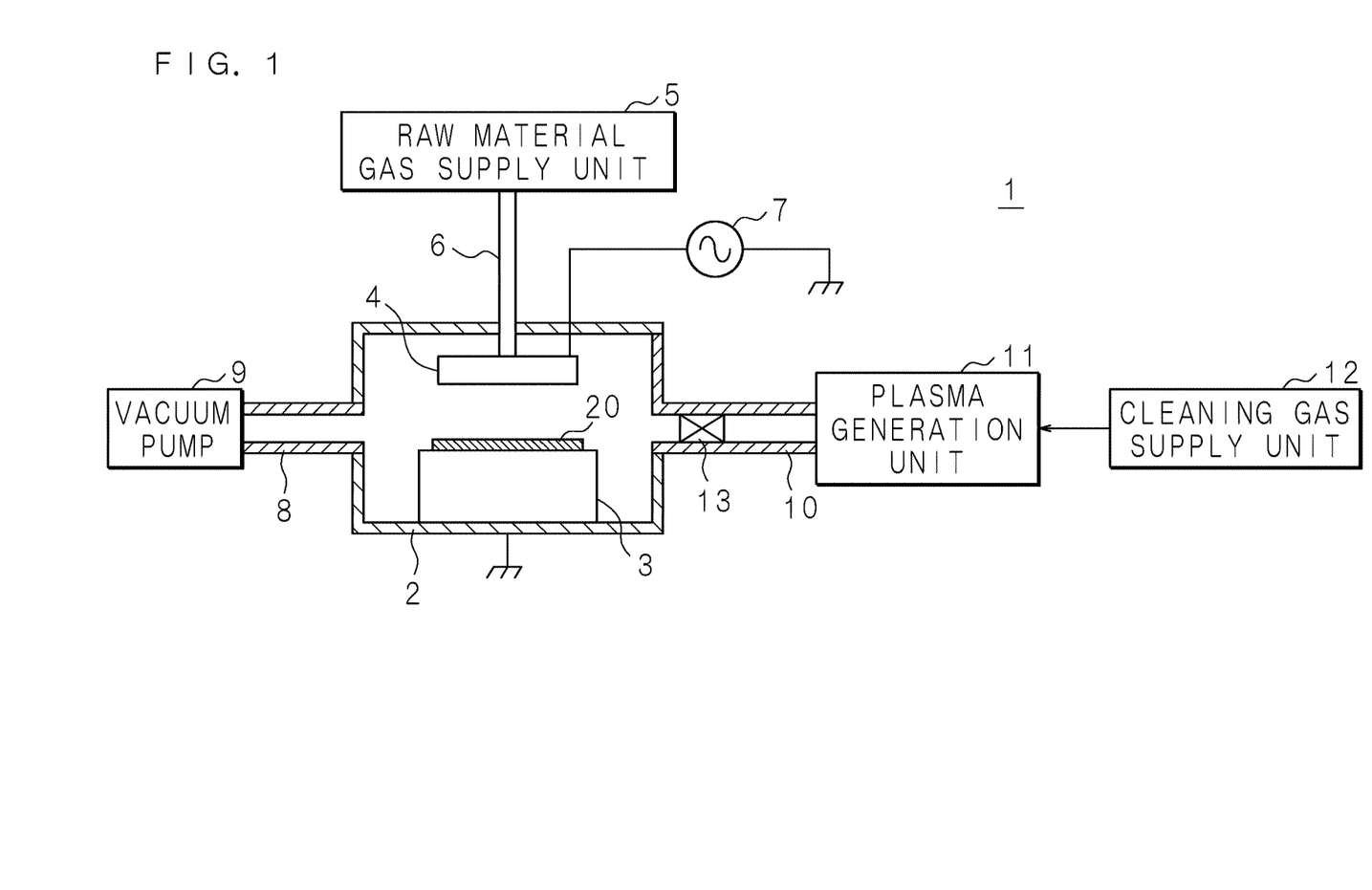
FIG. 1 is a schematic view schematically illustrating a configuration of a film deposition apparatus according to Embodiment 1.

Hereinafter, the present invention will be described with reference to the drawings illustrating a film deposition apparatus 1 according to Embodiment 1. FIG. 1 is a schematic view schematically illustrating a configuration of the film deposition apparatus 1.

The film deposition apparatus 1 includes a reaction chamber 2 made of an aluminum member. The reaction chamber 2 is provided with a mount table 3 therein, and a substrate 20 such as a glass substrate 20 or a silicon wafer is placed on the mount table 3. The mount table 3 is grounded.

A shower head 4 is disposed to face the mount table 3. A raw material gas supply unit 5 is provided outside the reaction chamber 2 to supply a raw material gas serving as a raw material for film deposition. The raw material gas supply unit 5 and the shower head 4 are connected with each other by a pipe 6. The shower head 4 is connected with a high-frequency power supply 7.

The reaction chamber 2 is connected to a vacuum pump 9 through a discharge pipe 8, and is connected to a plasma generation unit 11 through a supply pipe 10. The supply pipe 10 is made of an aluminum member.

The supply pipe 10 has an on/off valve 13 installed therebetween. The cleaning gas (for example, $NF_3$ or $C_2F_6$) is supplied from the cleaning gas supply unit 12 to the plasma generation unit 11. The plasma generation unit 11 turns the cleaning gas into plasma under an atmosphere of an inert gas (for example, Ar or He).

Figure 2:
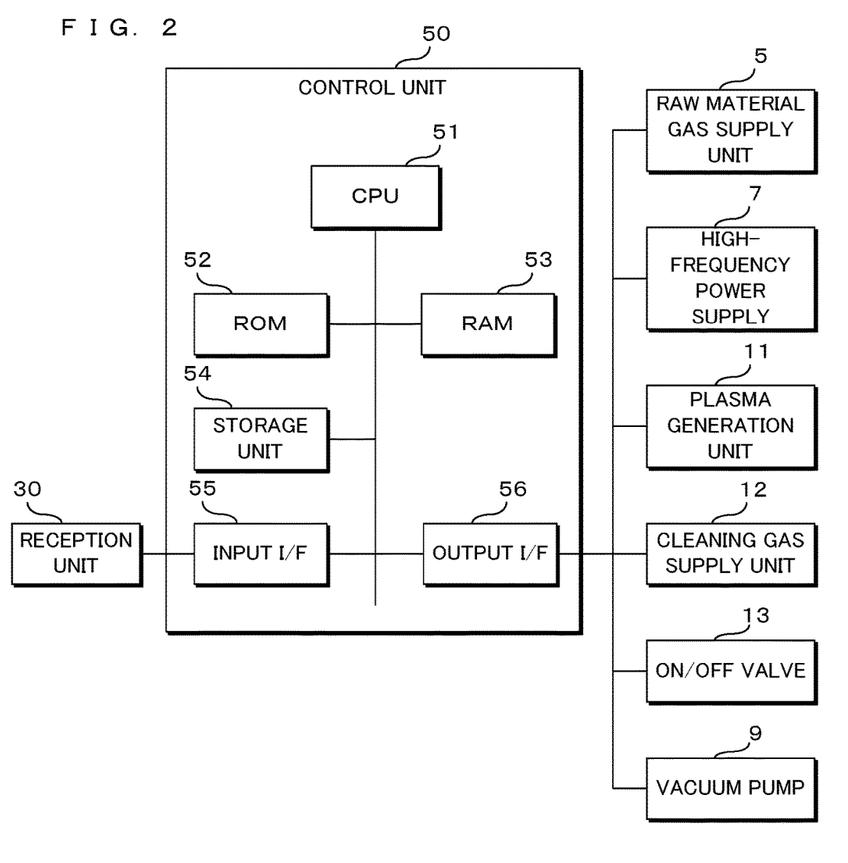
FIG. 2 is a block diagram illustrating a control unit of the film deposition apparatus.

FIG. 2 is a block diagram illustrating a control unit 50 of the film deposition apparatus 1. The control unit 50 includes a central processing unit (CPU) 51, a read only memory (ROM) 52, a random access memory (RAM) 53, a storage unit 54, an input interface (input I/F) 55, and an output interface (output I/F) 56. The storage unit 54 is composed of a rewritable nonvolatile memory such as an erasable programmable ROM (EPROM), an electrically erasable programmable ROM (EEPROM) or the like. The CPU 51 has a timer.

The CPU 51 reads a control program stored in the ROM 52 and writes it to the RAM 53, and controls driving of the film deposition apparatus 1. A signal is input to the input I/F 55 from a reception unit 30 such as a keyboard or a touch panel which receives an operation of a user. The CPU 51 outputs driving or stopping signals to the raw material gas supply unit 5, the high-frequency power supply 7, the plasma generation unit 11, the cleaning gas supply unit 12 and the vacuum pump 9 through the output I/F 56. In addition, the CPU 51 outputs an on or off signal to the on/off valve 13 through the output I/F 56.

Film deposition processing will be described. Upon receiving a signal for starting the film deposition processing from the reception unit 30, the CPU 51 drives the raw material gas supply unit 5 and the high-frequency power supply 7. Further, in an initial state, the vacuum pump 9 is driven.

By the driving of the vacuum pump 9, the inside of the reaction chamber 2 is maintained at a predefined pressure, and by the driving of the raw material gas supply unit 5, the raw material gas is supplied to the shower head 4 through the pipe 6. By the driving of the high-frequency power supply 7, a voltage is applied between the shower head 4 and the mount table 3, and the raw material gas turned into plasma is adhered to the substrate 20 to form a thin film on the substrate 20.

After the film deposition ends, the CPU 51 drives the raw material gas supply unit 5 and the high-frequency power supply 7. The substrate 20 is taken out from the reaction chamber 2 by a robot (not illustrated). The thin film is also adhered to and deposited on a wall surface of the reaction chamber 2.

Cleaning processing will be described. In the initial state, the on/off valve 13 is closed, and the vacuum pump 9 is driven. Upon receiving the signal for starting the cleaning processing from the reception unit 30, the CPU 51 outputs an on signal to the on/off valve 13, and outputs a drive signal to the cleaning gas supply unit 12 and the plasma generation unit 11.

As the on/off valve 13 is open, the cleaning gas is supplied from the cleaning gas supply unit 12 to the plasma generation unit 11, and the cleaning gas turned into plasma is supplied from the plasma generation unit 11 to the reaction chamber 2. The deposits adhered to the wall surface of the reaction chamber 2 are vaporized and discharged to the outside by the vacuum pump 9. The CPU 51 outputs a stop signal to the cleaning gas supply unit 12 and the plasma generation unit 11 to stop the cleaning gas supply unit 12 and the plasma generation unit 11. In addition, the CPU 51 outputs an off signal to the on/off valve 13 to close the on/off valve 13.

Since the reaction chamber 2 and the supply pipe 10 are made of the aluminum member, when the plasma generated from the cleaning gas contains fluorine radicals, the fluorine radicals react with the reaction chamber 2 and the supply pipe 10, such that aluminum fluoride is generated in the reaction chamber 2 and the supply pipe 10.

The aluminum fluoride generated in the reaction chamber 2 is discharged to the outside by the vacuum pump 9. However, after the on/off valve 13 is closed, the aluminum fluoride generated in the supply pipe 10 is not discharged. When the aluminum fluoride is cooled, it is likely to be deposited, and in particular, when left for a long period of time, a large amount of particles due to the aluminum fluoride are generated in the supply pipe 10.

In order to prevent the generation of the large amount of particles in the supply pipe 10, a user can perform continuous cleaning processing.

Figure 3:
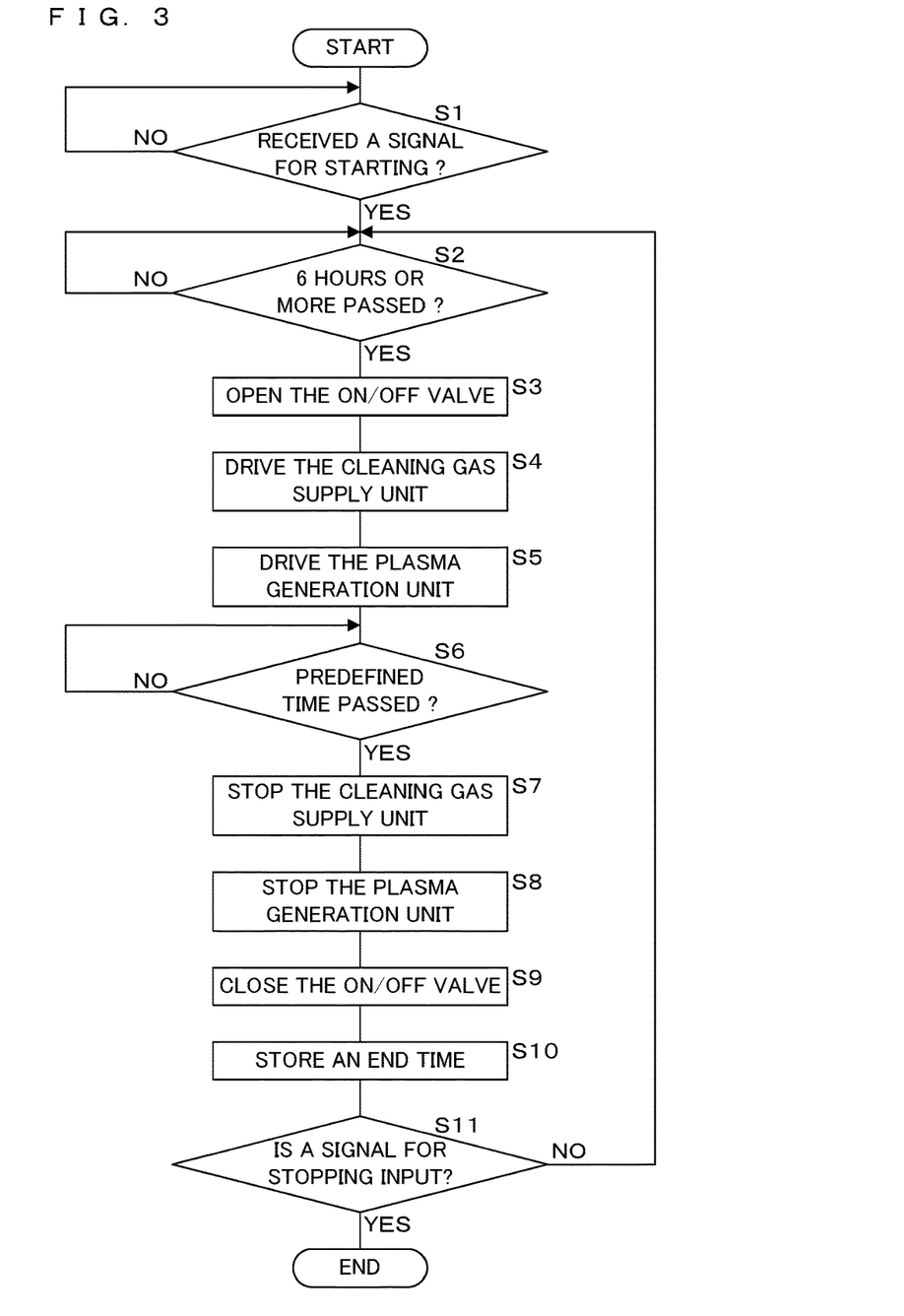
FIG. 3 is a flowchart for describing continuous cleaning processing by the control unit.

FIG. 3 is a flowchart for describing the continuous cleaning processing by the control unit 50. Further, in the initial state, the CPU 51 stores a time in which the cleaning processing or the continuous cleaning processing ends in the storage unit 54. Furthermore, the vacuum pump 9 is driven in this state.

The CPU 51 waits until receiving a signal for starting the continuous cleaning processing from the reception unit 30 (NO in step S1). When receiving the signal for starting the continuous cleaning processing (YES in step S1), the CPU 51 determines whether 6 hours or more passes from the time when the previous cleaning processing or the continuous cleaning processing ends (step S2).

If 6 hours or more does not pass from the time when the previous cleaning processing or the continuous cleaning processing ends (NO in step S2), the CPU 51 returns the processing to step S2.

If 6 hours or more passes from the time when the previous cleaning processing or the continuous cleaning processing ends (YES in step S2), the CPU 51 outputs an open signal to the on/off valve 13 to open the on/off valve 13 (step S3). Then, the CPU 51 outputs a drive signal to the cleaning gas supply unit 12 (step S4), and outputs a drive signal to the plasma generation unit 11 (step S5).

The cleaning gas supplied from the cleaning gas supply unit 12 is turned into plasma by the plasma generation unit 11, and the cleaning gas turned into plasma is sent to the supply pipe 10.

Further, an amount of the cleaning gas supplied to the plasma generation unit 11 is preset so that the temperature in a case of turning into plasma reaches about 200° C. Therefore, the temperature of the supply pipe 10 also reaches about 200° C. After the temperature of the supply pipe 10 reaches about 200° C., the supply pipe 10 maintains temperature at which the deposition of particles can be prevented until about 6 hours passes. Therefore, the control unit 50 constitutes a temperature control unit by executing the processing of steps S4 and S5.

Further, the amount of the cleaning gas supplied to the plasma generation unit 11 may be set in advance so that the temperature in the case of turning into plasma reaches about 100° C. to 200° C. Even in this case, the supply pipe 10 maintains the temperature at which the deposition of particles can be prevented until 5 to 6 hours passes.

The cleaning gas turned into plasma is discharged together with substances such as gas remaining in the supply pipe 10.

The CPU 51 waits until a predefined time, for example 30 minutes, passes after the drive signal is output to the cleaning gas supply unit 12 and the plasma generation unit 11 (NO in step S6).

When the predefined time passes (YES in step S6), the CPU 51 outputs a stop signal to the cleaning gas supply unit 12 (step S7), and outputs a stop signal to the plasma generation unit 11 (step S8).

Next, the CPU 51 outputs an off signal to the on/off valve 13 to close the on/off valve 13 (step S9). Then, with reference to the timer, the time (an end time) is stored in the storage unit 54 (step S10). Thereafter, the CPU 51 determines whether a signal for stopping the continuous cleaning processing is received from the reception unit 30 (step S11).

If the signal for stopping the continuous cleaning processing is not received (NO in step S11), the CPU 51 returns the processing to step S2. When the signal for stopping the continuous cleaning processing is received (YES in step S11), the CPU 51 stops the continuous cleaning process.

Further, in step S2, 6 hours is set as a threshold value, but the threshold value is not limited thereto. Generally, when left for 36 hours or more after the end of the cleaning, due to the cooling of the supply pipe 10, a large amount of particles are generated in the supply pipe 10. Therefore, the threshold value may be 36 hours or less. Depending on a specification of the film deposition apparatus 1, values such as 24 hours or less, 12 hours or less, or 6 hours or less may be set as the threshold value.

In the film deposition apparatus 1 under a predefined specification, when the threshold value is 6 hours or less, the aluminum fluoride, and the like in the supply pipe 10 may be discharged, before the deposition of particles is too apparent. In this case, after the temperature of the supply pipe 10 reaches about 100° C. to 200° C., considering a time in which the temperature for preventing the deposition can be maintained and a drive efficiency of the film deposition apparatus 1, 5 to 6 hours is appropriate as the threshold value.

Further, before executing the continuous cleaning processing, a film for preventing etching of the reaction chamber 2 may be formed in advance on the inner wall of the reaction chamber 2. Furthermore, in the continuous cleaning processing, the amount of the cleaning gas supplied to the plasma generation unit 11 may be smaller than the amount of the cleaning gas supplied in the cleaning processing (common cleaning processing). In this case, a consumption of the cleaning gas in the continuous cleaning processing can be reduced.

In the film deposition apparatus 1 and the cleaning method thereof according to Embodiment 1, since cleaning is performed for 24 hours or less from the end of the previous cleaning, it is possible to discharge the substances in the supply pipe 10, before the deposition of particles is too apparent.

Since the temperature of the plasma generated by the plasma generation unit 11 is set to be 100° C. or higher, and the temperature of the supply pipe 10 is set to be 100° C. or higher, the temperature of the supply pipe 10 reaches temperature at which particles are not deposited.

Further, since the substances such as gas in the supply pipe 10 are discharged at an interval of 6 hours, even when particles are deposited thereon, it is possible to promptly discharge the deposits to the outside.

Embodiment 2

Figure 4:
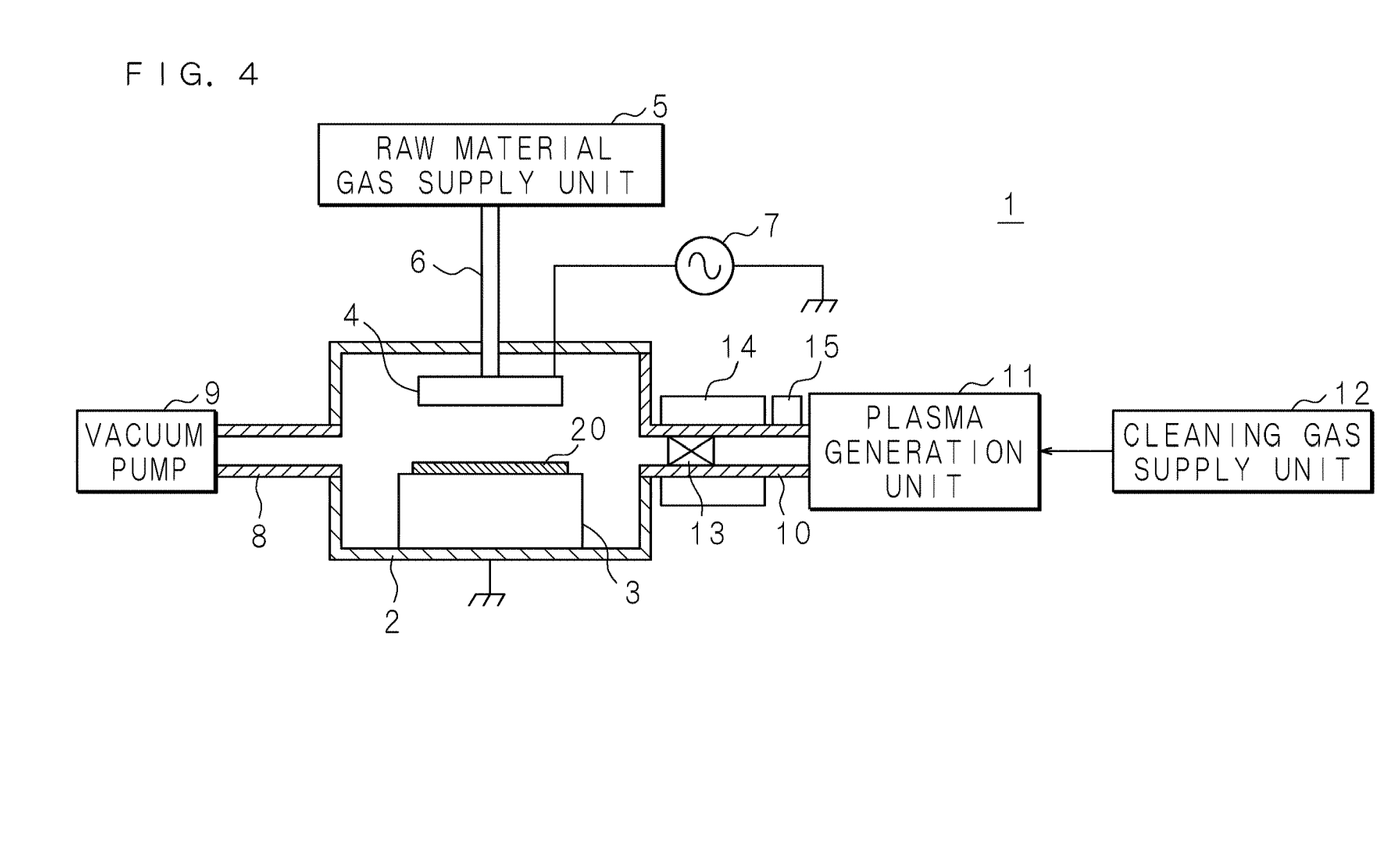
FIG. 4 is a schematic view schematically illustrating a configuration of a film deposition apparatus according to Embodiment 2.

Hereinafter, the present invention will be described with reference to the drawings illustrating a film deposition apparatus 1 according to Embodiment 2. FIG. 4 is a schematic view schematically illustrating a configuration of the film deposition apparatus 1. The supply pipe 10 is provided with a heater 14 around thereof. In addition, the supply pipe 10 is provided with a temperature sensor 15 thereon.

Figure 5:
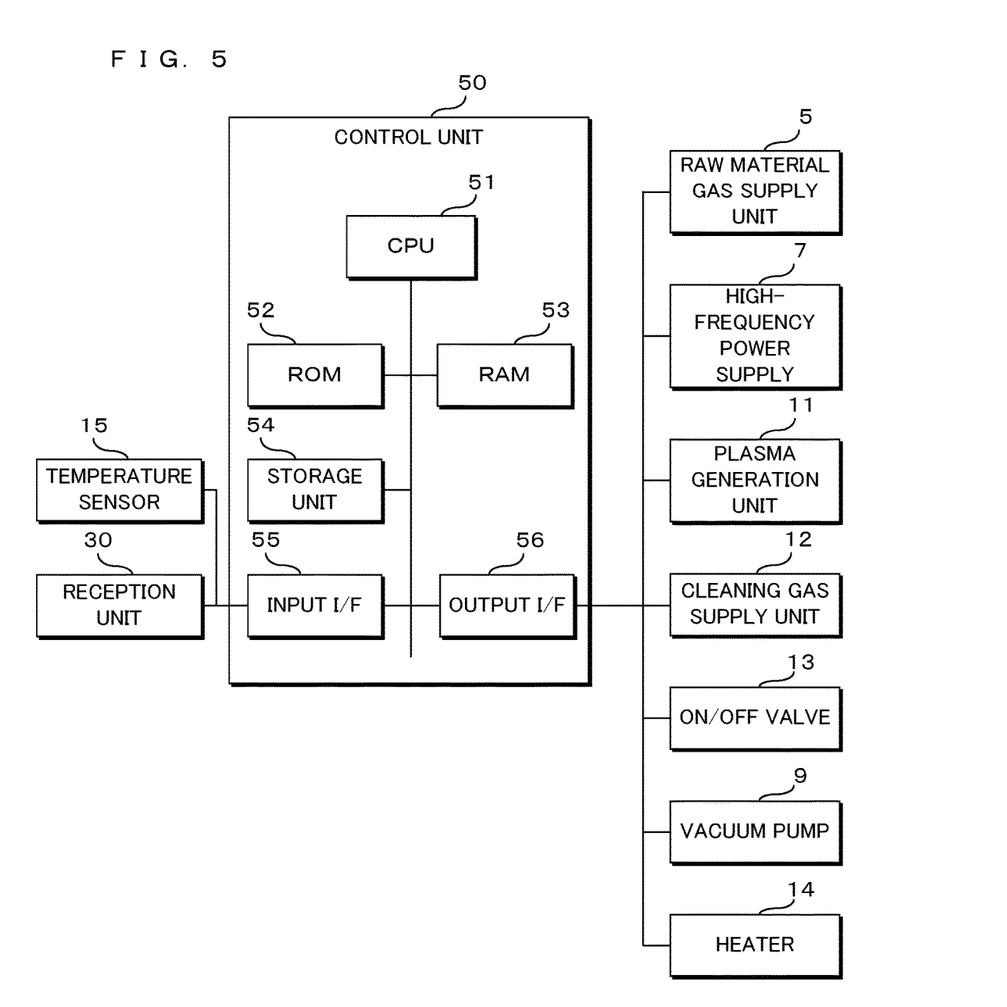
FIG. 5 is a block diagram illustrating a control unit of a film deposition apparatus 1.

FIG. 5 is a block diagram illustrating a control unit 50 of the film deposition apparatus 1. A signal indicating temperature of the supply pipe 10 is input to the input I/F 55 from the temperature sensor 15. The CPU 51 outputs an on or off signal to the heater 14 through the output I/F 56.

Figure 6:
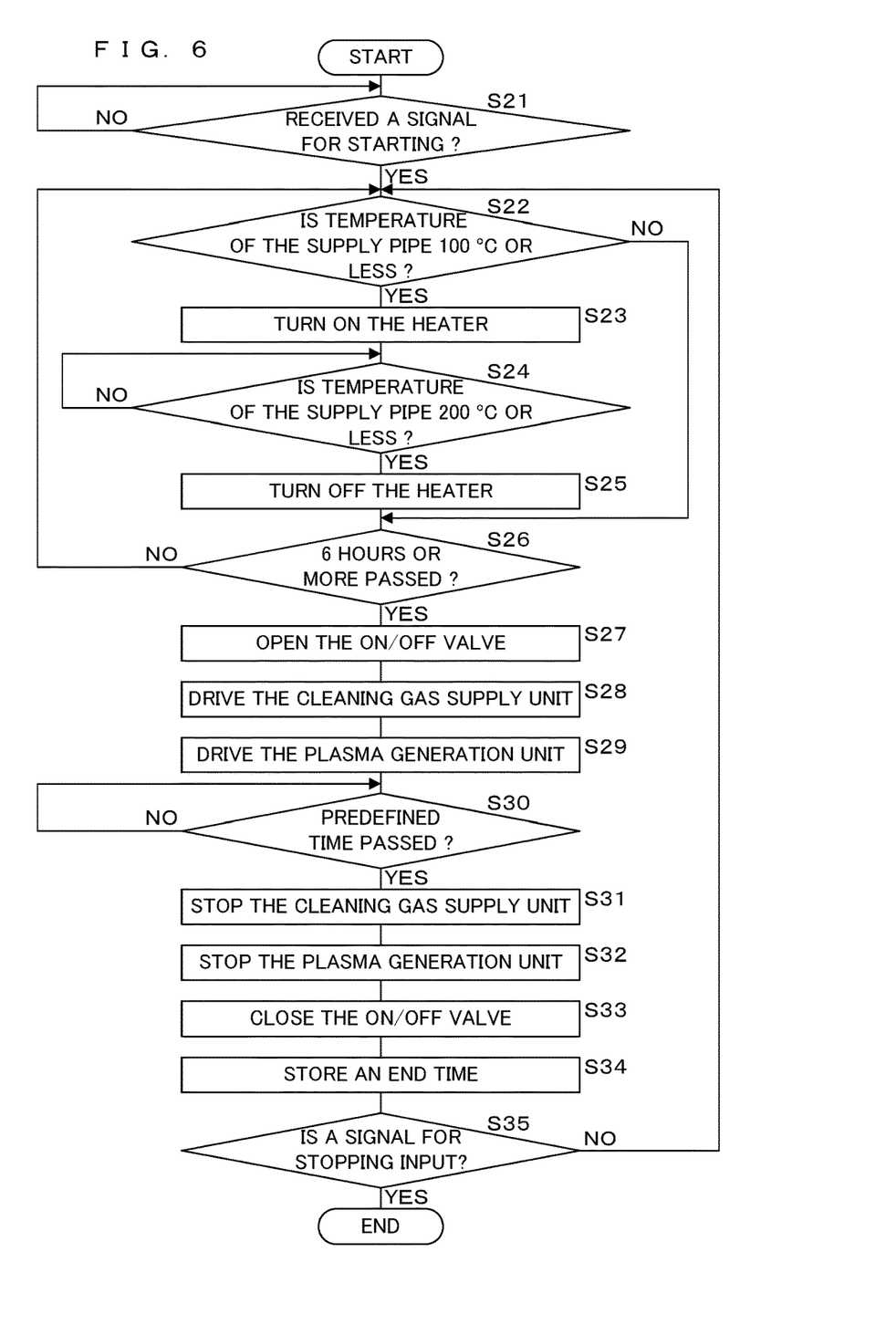
FIG. 6 is a flowchart for describing continuous cleaning processing by the control unit.

FIG. 6 is a flowchart for describing the continuous cleaning processing by the control unit 50. Further, in the initial state, the CPU 51 stores a time in which the cleaning processing or the continuous cleaning processing ends in the storage unit 54. Furthermore, the vacuum pump 9 is driven in this state.

The CPU 51 waits until receiving a signal for starting the continuous cleaning processing from the reception unit 30 (NO in step S21). When receiving the signal for starting the continuous cleaning processing (YES in step S21), the CPU 51 takes a signal from the temperature sensor 15, and determines whether the temperature of the supply pipe 10 is 100° C. or less (step S22). If the temperature of the supply pipe 10 is not 100° C. or less (NO in step S22), the CPU 51 progresses the processing to step S26 to be described below.

When the temperature of the supply pipe 10 is 100° C. or less (YES in step S22), the CPU 51 outputs an on signal to the heater 14 (step S23), takes a signal from the temperature sensor 15, and determines whether the temperature of the supply pipe 10 is 200° C. or higher (step S24). If the temperature of the supply pipe 10 is not 200° C. or higher (NO in step S24), returns the processing to step S24.

When the temperature of the supply pipe 10 is 200° C. or higher (YES in step S24), the CPU 51 outputs an off signal to the heater 14 (step S25), and determines whether 6 hours or more passes from the time when the previous cleaning processing or the continuous cleaning processing ends (step S26).

If 6 hours or more does not pass from the time when the previous cleaning processing or the continuous cleaning processing ends (NO in step S26), the CPU 51 returns the processing to step S22.

If 6 hours or more passes from the time when the previous cleaning processing or the continuous cleaning processing ends (YES in step S26), the CPU 51 outputs an open signal to the on/off valve 13 to open the on/off valve 13 (step S27). Then, the CPU 51 outputs a drive signal to the cleaning gas supply unit 12 (step S28), and outputs a drive signal to the plasma generation unit 11 (step S29).

The CPU 51 waits until a predefined time, for example 30 minutes, passes after the drive signal is output to the cleaning gas supply unit 12 and the plasma generation unit 11 (NO in step S30).

When the predefined time passes (YES in step S30), the CPU 51 outputs a stop signal to the cleaning gas supply unit 12 (step S31), and outputs a stop signal to the plasma generation unit 11 (step S32).

Next, the CPU 51 outputs an off signal to the on/off valve 13 to close the on/off valve 13 (step S33). Then, with reference to the timer, the time (an end time) is stored in the storage unit 54 (step S34). Thereafter, the CPU 51 determines whether a signal for stopping the continuous cleaning processing is received from the reception unit 30 (step S35).

If the signal for stopping the continuous cleaning processing is not received (NO in step S35), the CPU 51 returns the processing to step S22. When the signal for stopping the continuous cleaning processing is received (YES in step S35), the CPU 51 stops the continuous cleaning process.

In the film deposition apparatus 1 and the method for cleaning the film deposition apparatus 1 according to Embodiment 2, the supply pipe 10 is heated by the heater 14, and the temperature of the supply pipe 10 is set to be 100° C. or higher, thereby it is possible to prevent an occurrence of particles in the supply pipe 10. Since the temperature of the supply pipe 10 is detected by the temperature sensor 15, the temperature of the supply pipe 10 may be appropriately maintained.

The same parts of the configuration of the film deposition apparatus 1 according to Embodiment 2 as those in Embodiment 1 will be denoted by the same reference numerals, and will not be described in detail.

It is to be noted that, as used herein and in the appended claims, the singular forms "a", "an", and "the" include plural referents unless the context clearly dictates otherwise.

As this description may be embodied in several forms without departing from the spirit of essential characteristics thereof, the present embodiment is therefore illustrative and not restrictive, since the scope is defined by the appended claims rather than by the description preceding them, and all changes that fall within metes and bounds of the claims, or equivalence of such metes and bounds thereof are therefore intended to be embraced by the claims.

The invention claimed is:

1. A film deposition apparatus, comprising:
   a chamber to carry out a film deposition processing in which a thin film is formed on a substrate;
   a cleaning gas supply unit to supply a cleaning gas;
   a plasma generation unit which turns the cleaning gas supplied from the cleaning gas supply unit into plasma;
   a supply pipe to supply the cleaning gas turned into plasma by the plasma generation unit to the chamber; and
   a control unit, wherein
   the control unit carries out a first cleaning processing to remove a deposition on a wall of the chamber which is formed in the film deposition processing, controlling the cleaning gas supply unit and the plasma generation unit, and supplying the cleaning gas turned into plasma to the chamber through the supply pipe, and
   after carrying out the first cleaning processing and before predefined time is passed which is defined on the basis of an attainment temperature of the supply pipe in the first cleaning processing, the control unit carries out a second cleaning processing consecutively after the first cleaning processing to remove a deposition remained in the supply pipe after the first cleaning processing, controlling the cleaning gas supply unit and the plasma generation unit, and supplying the cleaning gas turned into plasma to the chamber through the supply pipe which is utilized to supply the cleaning gas turned into plasma in the first cleaning processing.

2. The film deposition apparatus according to claim 1, wherein
   the predefined time is a time between after the supply pipe which reached the attainment temperature is left as it is before particles starts to emerge in the supply pipe.

3. The film deposition apparatus according to claim 1, wherein
   the control unit controls driving of the plasma generation unit so that temperature of the cleaning gas turned into plasma reaches the attainment temperature.

4. The film deposition apparatus according to claim 1, wherein
   the supply pipe is provided with a heater, and
   the control unit controls driving of the heater so that temperature of the supply pipe reaches the attainment temperature.

5. The film deposition apparatus according to claim 1, wherein
   after carrying out the second cleaning processing and before the predefined time is passed, the control unit carries out the second cleaning processing again.

6. The film deposition apparatus according to claim 1, wherein
   an amount of the cleaning gas supplied by the cleaning gas supply unit in the second cleaning processing is less than an amount of the cleaning gas supplied by the cleaning gas supply unit in the first cleaning processing.

7. The film deposition apparatus according to claim 1, wherein
   a film is formed on an inner wall of the chamber in order to prevent etching of the inner wall of the chamber before carrying out the second cleaning processing.

8. The film deposition apparatus according to claim 1, wherein
   the supply pipe is provided with an on/off valve which opens or closes a flow path of the cleaning gas turned into plasma, and
   the control unit opens the on/off valve in the case where the first or the second cleaning processing starts and closes the on/off valve after the first or the second cleaning processing is done.

9. The film deposition apparatus according to claim 1, wherein
   the attainment temperature is between 100° C. or more and 200° C. or less, and
   the predefined time is between 5 hours or more and 6 hours or less.

10. A method for cleaning a film deposition apparatus comprising:
    a chamber to carry out a film deposition processing in which a thin film is formed on a substrate;
    a cleaning gas supply unit to supply a cleaning gas;
    a plasma generation unit which turns the cleaning gas supplied from the cleaning gas supply unit into plasma; and
    a supply pipe to supply the cleaning gas turned into plasma by the plasma generation unit to the chamber,
    the method comprising steps of:
    carrying out a first cleaning processing for removal a deposition from a wall of the chamber in the film deposition processing, supplying the cleaning gas turned into plasma to the chamber through the supply pipe; and after carrying out the first cleaning processing and before predefined time is passed which is defined on the basis of an attainment temperature of the supply pipe in the first cleaning processing, carrying out a second cleaning processing consecutively after the first cleaning processing for removal a deposition remained in the supply pipe after the first cleaning processing, supplying the cleaning gas turned into plasma to the chamber through the supply pipe which is utilized to supply the cleaning gas turned into plasma in the first cleaning processing.

* * * * *